APPARATUS FOR SEVERING CIRCUIT PATTERNS ON A CIRCUIT BOARD

Original Filed March 8, 1967 4 Sheets-Sheet 1

INVENTORS
John D. Helms,
Herbert L. Brown Jr.

Nov. 17, 1970 J. D. HELMS ET AL 3,541,585

APPARATUS FOR SEVERING CIRCUIT PATTERNS ON A CIRCUIT BOARD

Original Filed March 8, 1967 4 Sheets-Sheet 2

APPARATUS FOR SEVERING CIRCUIT PATTERNS ON A CIRCUIT BOARD

Original Filed March 8, 1967 4 Sheets-Sheet 3

APPARATUS FOR SEVERING CIRCUIT PATTERNS ON A CIRCUIT BOARD

Original Filed March 8, 1967 4 Sheets-Sheet 4

United States Patent Office 3,541,585
Patented Nov. 17, 1970

3,541,585

APPARATUS FOR SEVERING CIRCUIT PATTERNS ON A CIRCUIT BOARD

John D. Helms and Herbert L. Brown, Ja., Dallas, Tex., assignors to Texas Instruments Incorporated, Dallas, Tex., a corporation of Delaware Original application Mar. 8, 1967, Ser. No. 621,552. Divided and this application Jan. 13, 1969, Ser. No. 804,039
Int. Cl. B26d 3/00, 7/06
U.S. Cl. 83—1 11 Claims

ABSTRACT OF THE DISCLOSURE

A lancing tool is described for removing portions of a circuit pattern on one face of a printed circuit board. A pair of cutter blades are moved simultaneously toward and away from the circuit pattern to remove the desired portion of the circuit pattern. Included is means for picking up and removing from the face of the circuit board, the part of the pattern cut away from the circuit board by the cutting blades.

This is a division of application Ser. No. 621,552 filed Mar. 8, 1967.

BACKGROUND OF THE INVENTION

Multilayer circuit boards are often manufactured by etching circuit patterns in conductive sheets on insulating substrates. The etched patterns form circuit paths which are referred to as being laid out on X and Y axes. Holes are provided through the substrates on what is called the Z axis for forming conductive connections through the substrates between their respective patterns so that when the substrates are assembled one above another they may be interconnected. Z axis interconnections between the patterns on the various substrates have been formed by first sensitizing the inside surface of the holes to accept metal plating and thereafter plating the holes with copper or other metals. This process does not always produce satisfactory connections between layers and it does not provide connections which can be readily tested except as parts of the entire circuit formed by the circuit board interconnections. When the substrate holes are formed by drilling, some of the substrate insulating material may smear onto adjacent portions of the metal pattern and prevent good electrical contact by the plated metal and the pattern on the substrate. Plated hole connections are also prone to failure, due to stresses in the completed circuit board, and they necessarily require immersion of the board in a liquid during plating.

The so-called Z axis interconnections can also be made by a built-up process for manufacturing a circuit board, whereby alternate layers of insulating and conductive materials are formed with posts on the conductive layers forming the Z axis connections. In other instances rigid pins, eyes or the like are used to form the circuit connections between layers on the circuit board. These various methods require considerable detailed time-consuming art work. Therefore a long period of time is required for the manufacture of a circuit board. The apparatus of the invention provides greatly simplified means for forming the Z axis interconnections between layers of a multilayer circuit board.

SUMMARY OF THE INVENTION

Among the several objects of the invention may be noted the provision of improved means for segmenting a conductive circuit pattern on one face of a circuit board, and for forming a conductive path from the circuit pattern on the board through a hole in the circuit board; the provision of such apparatus wherein the operations are performed mechanically and without using the usual chemical etching and plating operations; the provision of improved apparatus for chiseling a chip or slug from a printed circuit pattern on a circuit board and removing the slug from the board; and the provision of apparatus for removing a portion of a printed circuit pattern, wherein blades used for cutting the pattern are cleaned with each cycle of operation. Other objects and features will be in part apparent and in part pointed out hereinafter.

Apparatus of the invention comprises a lancing tool used for removing a chip or slug of metal from a circuit pattern on one face of a printed circuit board. The tool comprises a cutter which is mounted for movement toward and away from the circuit pattern for cutting the circuit pattern and effecting removal of the chip or slug from the pattern. After the circuit pattern has been segmented, a ribbon is inserted into a hole in the circuit board by a ribbon-inserting tool which forces part of the ribbon into the hole. Welding electrodes are engageable with a part of the ribbon for welding the ribbon to portions of conductive patterns on the boards near the hole.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
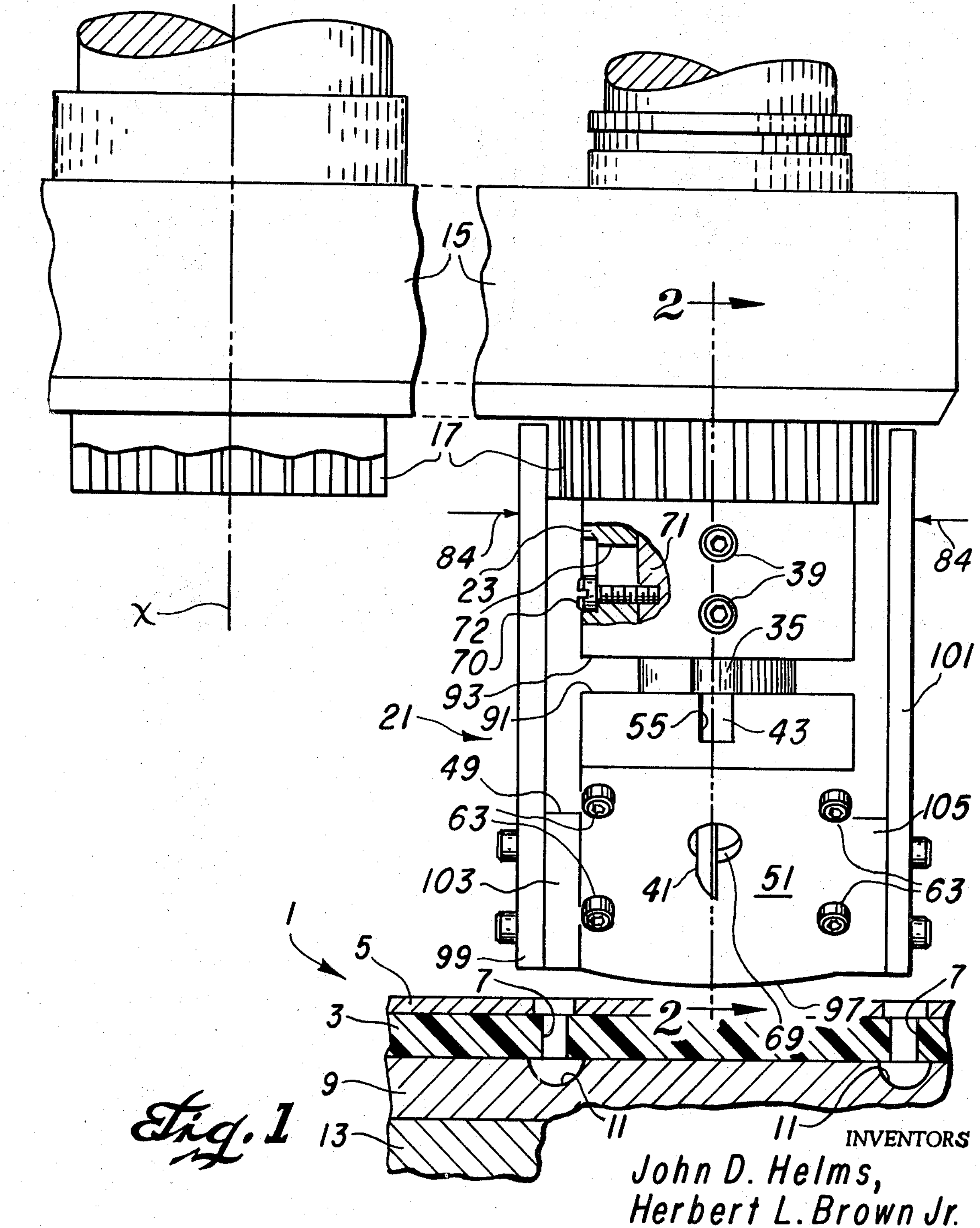
FIG. 1 is an elevation, partially cut away, of a lancing tool positioned over a circuit board and mounted on apparatus for controlling its operation.
Figures 4, 5:
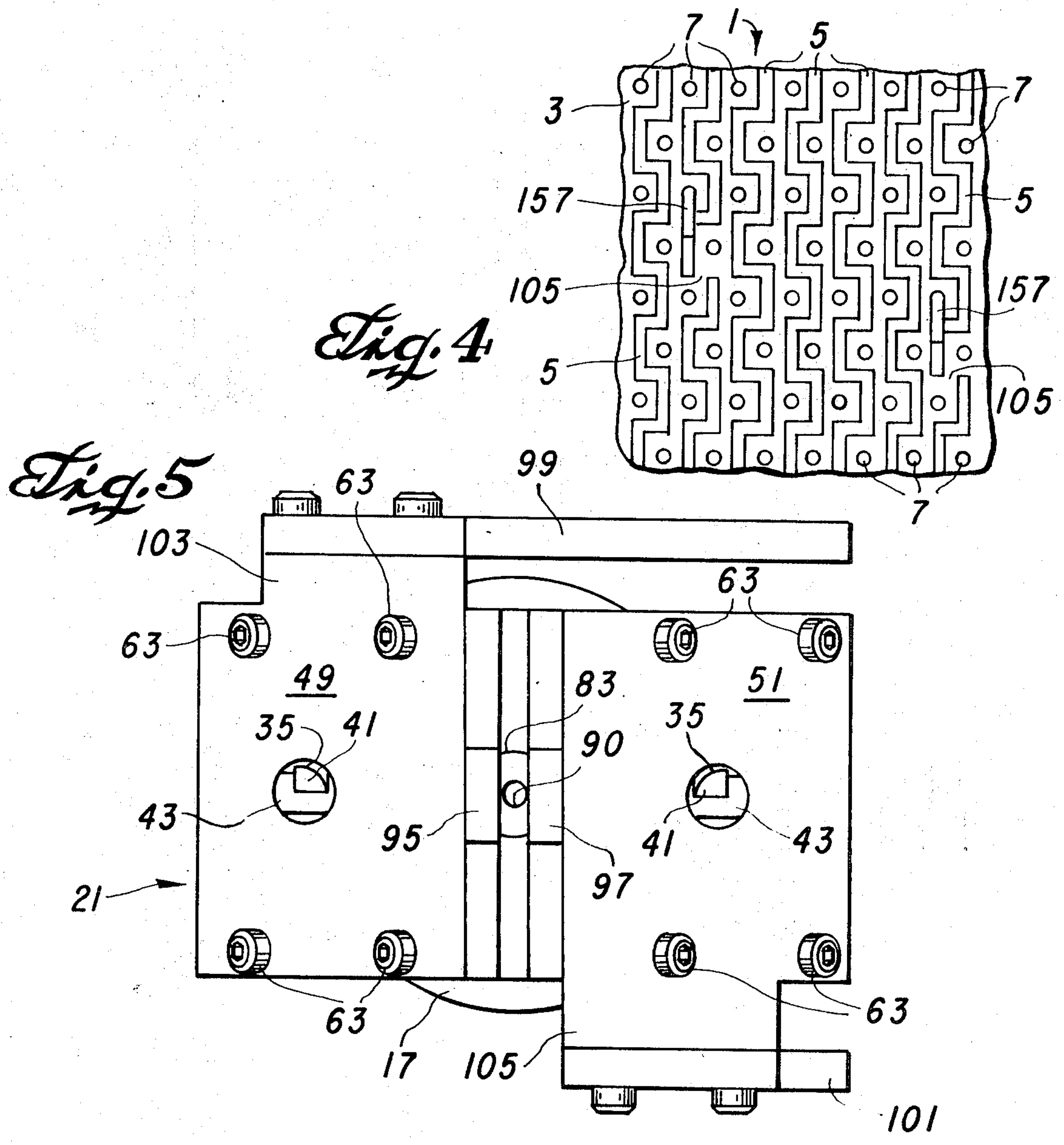
FIG. 4 is a fragmentary plan of a circuit board showing portions of the circuit pattern segmented.
FIG. 5 is a view of the bottom of the lancing tool.

The apparatus of the invention is particularly useful for the manufacture of multilayer circuit boards as disclosed in U.S. Pat. 3,470,612 issued Oct. 7, 1969. Said patent discloses the manufacture of multilayer circuit boards from a plurality of individual circuit boards or substrates having standardized conductive circuit patterns on the faces of the substrates. FIGS. 1 and 4 of the drawings illustrate part of a typical standardized circuit board or substrate such as disclosed in said application. The circuit board is generally designated 1 in FIG. 4 and its thickness is exaggerated for the purpose of clarity. It comprises a thin sheet 3 of electrical insulating material having a thin circuit pattern 5 on one of its faces and a plurality of holes 7 through the sheet. The pattern 5 comprises a plurality of zig-zag bars or ribbons which extend in one direction of the substrate. The conductive pattern may be formed of any suitable electrically conductive material, such as cooper or nickel, and may be formed on the substrate by plating and etching or the like. The arrangement and number of holes in the substrate are variable. The holes are preferably equally spaced. By way of example, holes 7 may have their centers spaced apart about 0.1 inch as measured from the top to bottom in FIG. 4 and about 0.05 inch between centers of the holes as measured from left to right. It will be understood that the pattern of conductive material may be different on various substrates or boards making up a multilayer circuit board. Reference is made to the above-mentioned Pat. 3,470,612 for disclosure of other typical usable circuit patterns. The apparatus of this invention is used for severing and dividing the conductive pattern 5 into discrete segments and for forming through connections from the pattern segments through the holes 7 of the circuit board.

The circuit board 1 is placed on a plate or fixture 9 (FIG. 1). The fixture has a plurality of openings or recesses 11 arranged so that when the circuit board layer is properly placed on the fixture each hole 7 is in register with one of the openings or recesses 11. The fixture is carried on a conventional so-called X–Y table 13 which is adapted to be moved in two directions perpendicular to each other (i.e., in an X or Y direction). Normally the table is mounted for movement in a substantially horizontal plane. The table may be part of conventional numerically controlled, punch-tape-operated apparatus comprising a rotatable circular turret 15 on which are several sleeves or adapters 17 spaced about the periphery of the turret for mounting tools or other devices for performing work. Only a portion of the circular turret is shown in FIG. 1. The turret rotates about a vertical axis X passing through the center of the turret. The sleeves 17 and tools carried by them are moved vertically by the punch-tape-operated apparatus. The tools of the invention can be used with any suitable equipment having a table for holding the circuit board and a sleeve or other mounting means for moving the tool toward and away from the work table during a cycle of operation.

Figure 2:
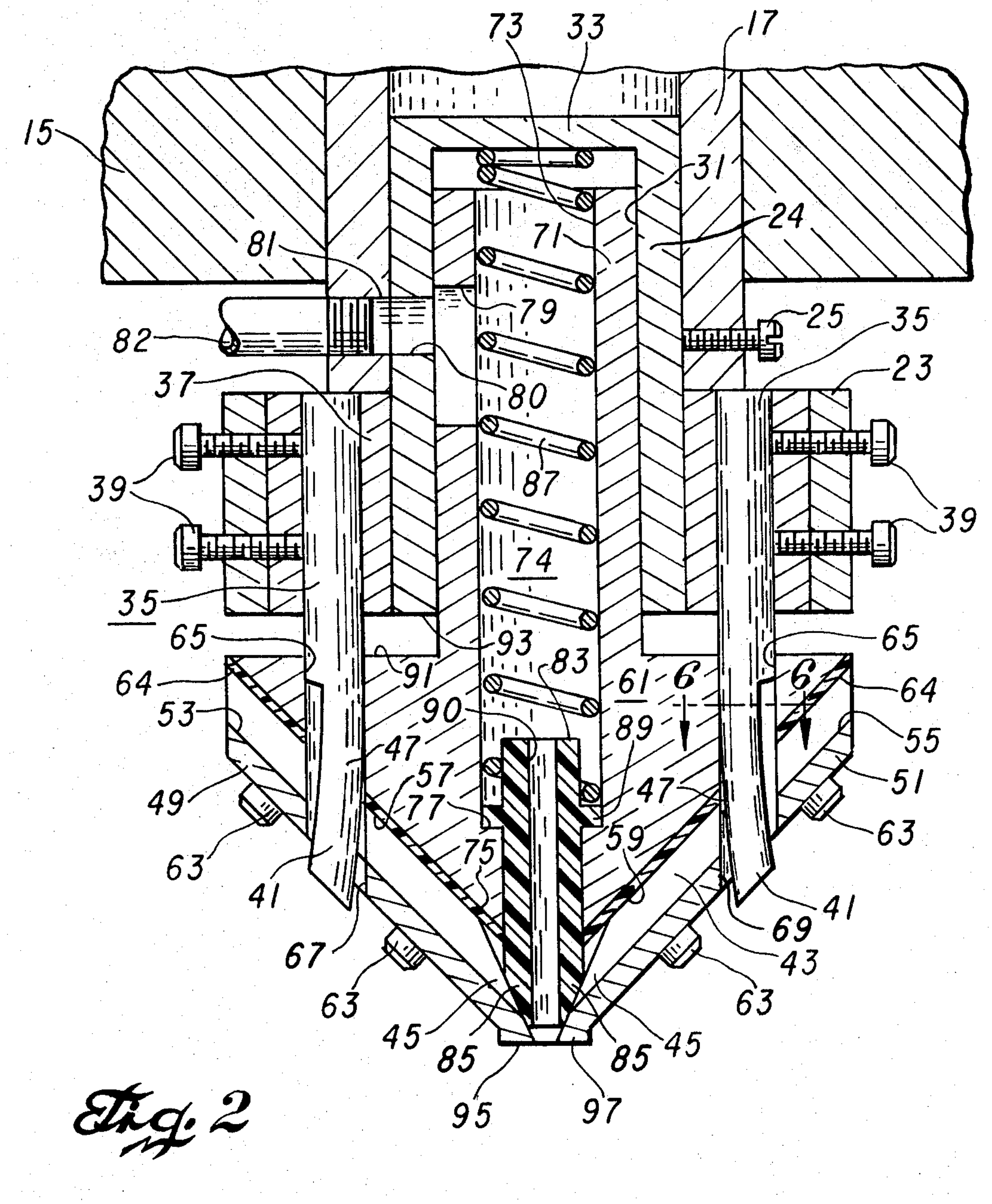
FIG. 2 is a section taken along line 2—2 of FIG. 1.
Figure 3:
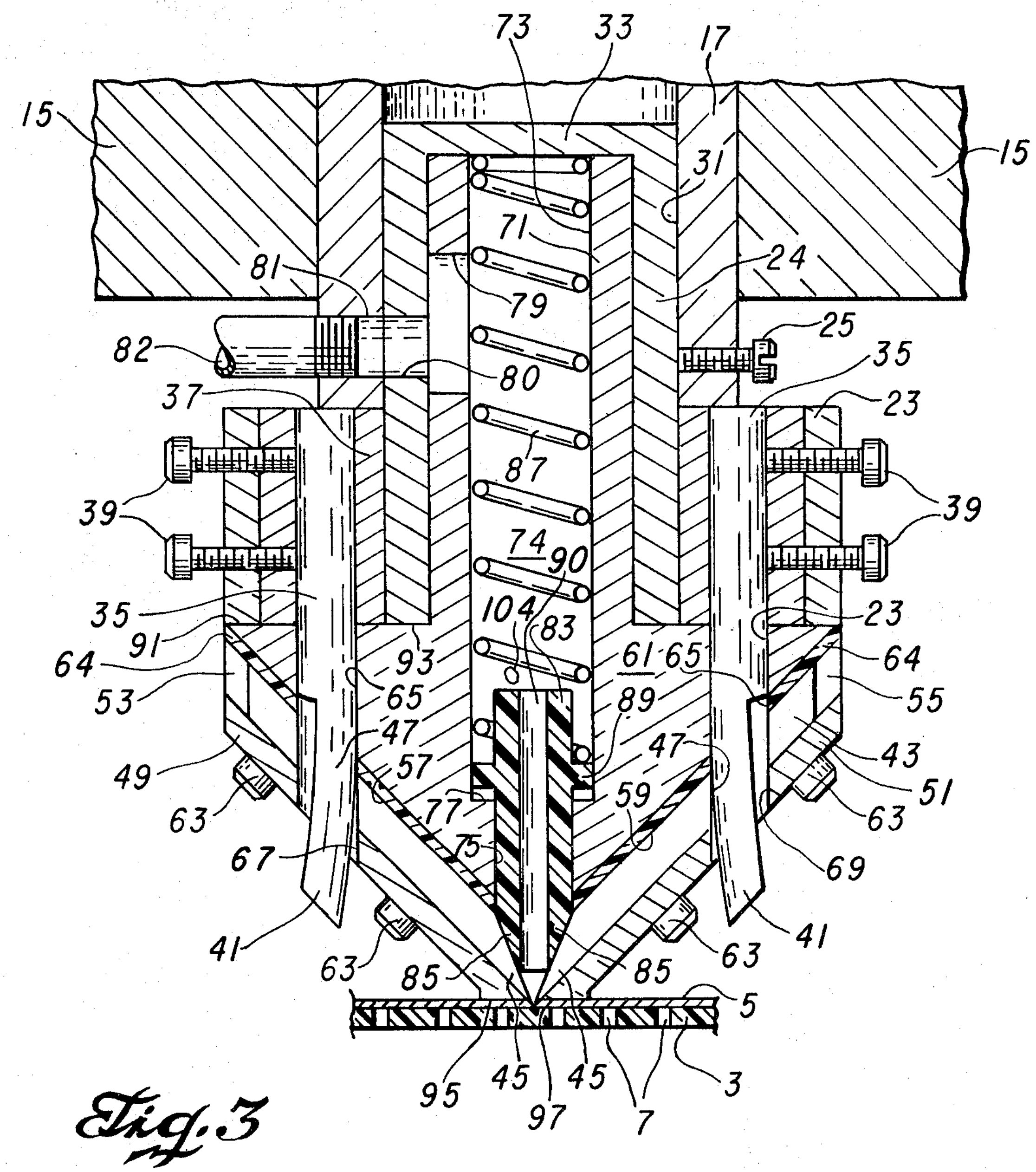
FIG. 3 is a section similar to FIG. 2 showing the parts in a moved position.

As illustrated in FIGS. 1–3, a lancing tool 21 of this invention comprises a body 23 having a hollow stem portion 24 which fits within sleeve 17. A screw 25 in the sleeve bears against stem 24 to mount the tool in the sleeve for vertical movement with the sleeve. The stem has a cylindric inner wall 31 and it is closed at its inner end by a wall 33.

A pair of translatory cams 35 have cylindric upper end portions received in sleeves 37 in the tool body. The cams and sleeves are fixed in the body by set screws 39. The axis of the upper portion of each cam 35 is generally vertical and the cams move vertically with the body. The cams have offset lower end portions 41 which are smaller than the upper portions thereof. Ends 41 project from the tool body and diverge from each other and away from the vertical axis of the upper part of the cams.

The tool has two elongate cutting members or lances 43. Each member 43 has an end portion which tapers to a sharp blade or knife edge designated 45. The edges 45 are normally spaced apart a slight distance and they are moved toward and away from each other as shown in FIGS. 2 and 3. The cutting members constitute lances and are used for removing a chip or slug of a printed circuit pattern 5 from the face of the circuit board during a chiseling operation described later.

Figure 6:
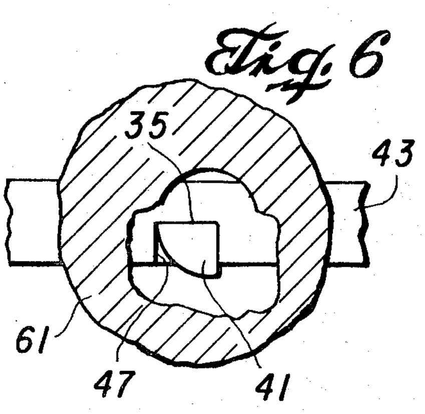
FIG. 6 is a fragmentary section taken along line 6—6 of FIG. 2.

The cutting members are preferably generally rectangular in transverse cross section and their longitudinal axes are substantially perpendicular to each other and an angle of about 45° relative to the face of the circuit board. Each of the cutting members has a notch 47 (FIG. 6) which receives the lower end 41 of the respective cam. There are close fits between the cam ends 41 and the walls of notches 47. The axis of each notch 47 is disposed at an acute angle with respect to the longitudinal axis of the cutting member 43, and the angular relation between the lances and their respective cams is such that vertical movement of the cams (i.e., perpendicular to the face of the circuit board) causes longitudinal or endwise movement of the lances toward or away from each other in substanitally perpendicular planes and at angles of about 45° relative to the face of the circuit board.

A pair of plates 49 and 51 have open-end channel-shaped recesses 53 and 55, respectively, which receive the lances and guide them in their movement toward and away from each other. The plates 49, 51 are bolted to lower inclined surfaces 57 and 59 of a carrier 61 by mounting bolts 63 (FIGS. 1–3 and 5). The cutters and plates are electrically insulated from the carrier by sheets of insulation designated 64. The upper parts of the cams 35 project into holes 65 in the carrier for guiding movement of the carrier with respect to the body. The lower parts 41 of the cams project through holes 65 and through holes 67 and 69 in plates 49 and 51, respectively. The holes 65, 67 and 69 are somewhat larger than the cam ends 41.

The carrier 61 has a cylindric stem portion 71 which projects into the hole defined by wall 31 in body 23 to guide vertical movement of the carrier relative to the body 23. A set screw screw 70 (FIG. 1) extends through a vertically disposed slot 72 in the body 23 and into the stem 71 of the carrier 61, thereby to mount the carrier on the body and permit limited extension of the carrier 61 from the body 23.

The carrier 61 has a counterbored passage 74 therethrough comprising an upper portion 73 and a somewhat smaller lower portion 75. A shoulder 77 is formed by the junction between the two portions of the passage. The passage is placed in communication with a vacuum supply through lateral ports 79, 80 and 81 in the stem, body and the sleeve 17. This is accomplished over a pipe 82 to which is attached a flexible hose, not shown.

A tubular wiper member 83 in passage 74 has tapered side edges 85 at its lower end which mate with the lance blade edges 45. The wiper edges 85 are adapted to slide along the lance blades as the lances move toward and away from each other. The wiper is biased toward the blade edges 45 by a compression spring 87 which reacts from the wall 33 of the body against an annular flange 89 on the outer surface of the wiper. Downward movement of the wiper 83 is limited by engagement between flange 89 and shoulder 77, as shown in FIG. 2. When the lances are moved toward each other the wiper is forced upwardly away from them against the biasing force of spring 87 so that it does not interfere with movement of the lances 43. When the lances 43 move away from each other from the FIG. 3 to the FIG. 2 position, the wiper surfaces 85 slide along lance blade edges 45 and wipe them clean of any circuit board material which they may have picked up during the lancing operation. There is a passage 90 through the wiper 83 for removing a slug of circuit pattern material as explained later.

The carrier has an upper surface 91 which is immediately beneath a surface 93 of the body. Normally spring 87 biases carrier 61 downwardly to separate surfaces 91 and 93 as shown in FIG. 2. Engagement between set screw 70 and the lower end of slot 72 prevents further downward movement of the carrier relative to the body. However, the length of slot 72 permits upward movement of the carrier relative to the body until the surfaces 91 and 93 are in engagement as shown in FIG. 3.

The center part of the lower edge of each plate 49 and 51 extends below the side edges of the plates to form a pair of contact pads or feet 95 and 97, respectively, which are adapted to contact the circuit pattern 5 on the upper face of the circuit board. Electric current is provided to the feet 95 and 97 through plates 49 and 51 from a pair of conductors 99 and 101. The conductor 99 is bolted to a flange 103 projecting from the side of the plate 49, and conductor 101 is bolted to a similar flange 105 on the side of plate 51. Electrical brushes shown by the arrows 84 on FIG. 1 engage the conductors 99 and 101 for bringing current to the tool. The conductors 99 and 101 provide means for initialy passing current between pads 95 and 97 through the segment of circit pattlern therebetween to heat and soften this segment of the circuit pattern and thus facilitate removal by the lances of a slug of the circuit pattern. After the lancing operation and while the pads 95, 97 are still in contact with the circuit pattern, a test signal is provided to pads 95, 97 to determine whether or not the lancing operation was effective in removing a slug of the circuit pattern metal. If current can still be passed between the pads, the lancing operation was not successful, but if current cannot be passed between the pads it indicates the lancing operation was successful in producing the desired electrical discontinuity.

Operation of the lancing tool is as follows:

Initially the X-Y table 13 is moved until the portion of the circuit pattern 5 beneath the tool is a portion which is to be removed to segment a bar of the printed circuit pattern and separate the segments by a gap which will electrically insulate or isolate the segments from each other. When the table stops, the sleeve 17 is moved downwardly during the first half cycle of the operation and then it returns to its FIG. 1 position. During downward movement of the sleeve the feet or pads 95 and 97 engage the circuit pattern 5 as shown in FIG. 3. This engagement prevents further movement of the carrier 61 but, due to the sliding fit between the carrier and the body of the tool, further downward movement of the body is permissible to the extent that surface 91 on the carrier and the surface 93 immediately above it are initially separated.

When pads 95 and 97 contact the circuit pattern it is preferred that short pulses of a large current be applied therebetween to heat and thereby soften the portion of the circuit pattern 5 between the pads, i.e., the portion of the pattern which is to be removed by operation of the tool. As sleeve 17 continues to move downwardly the cams 35 move through the carrier 61 and the notches in the cutting members 43 to effect movement of the cutting members from the FIG. 2 position toward each other to the FIG. 3 position. During this movement a slug or chip 104 (FIG. 3) of the circuit pattern is chiseled from the circuit pattern by the cutting edges or blades 45 on the lances. The vacuum lifts slug 104 from the surface of the circuit board and draws it upwardly through the tool. The removal of the slug 104 leaves a gap such as at 105 (FIG. 4) between two adjacent segments of a bar of the circuit pattern, thus providing electrical discontinuity between them. A test signal may also be applied to the pads 95, 97 to determine if the lancing operation has been successful in providing the desired electrical discontinuity between the segments of the circuit pattern.

The lances 43 reach their positions nearest each other for removal of the chip at the time the surfaces 91 and 93 come into engagement. Then the sleeve 17 begins the upward stroke of its cycle of operation. As this occurs, cams 35 are partially withdrawn from the lances, and the relative movement therebetween causes retraction of the lances from the FIG. 3 to the FIG. 2 position. Initially the body 23 moves upwardly while the carrier 61 remains stationary in its lowered position due to the action of the spring 87 in biasing the carrier downwardly with respect to the body of the tool. This biasing force acting against the wiper member holds it in engagement with the blade edges 45 as they are retracted, thereby wiping the blade edges clean of any circuit board material which may have adhered thereto.

Eventually the carrier 61 reaches its maximum extended position (as determined by the length of the slot 72) and then moves upwardly with the body of the tool and the sleeve 17. The X-Y table 13 is then moved to locate another portion of the circuit pattern beneath the tool and the operation is repeated until the lancing is completed.

What is claimed is:

1. A lancing tool for removing part of a circuit pattern on one face of a printed circuit board, the tool comprising:

- a tool body adapted to be moved with respect to the circuit pattern,
- a pair of cutting members, each of said cutting members having a blade,
- means mounting the cutting members for movement of the blades with respect to the circuit pattern,
- means carried by the body for effecting joint movement of the blades of the cutting members toward and away from the circuit pattern when the tool body is moved with respect to the circuit pattern, thereby cutting the circuit pattern to effect removal of part of the pattern, and
- means adjacent the cutting members for picking up and removing from said one face of a circuit board the part of the circuit pattern cut from the circuit board by the cutting members.

2. A tool according to claim 1 further comprising a passage in the tool adapted to be connected to a vacuum supply, the passage having an inlet end adjacent the blades of the cutting members so that the part of the circuit pattern removed by the cutting members is drawn into the passage.

3. A tool according to claim 1 further comprising a pair of contact members engageable with the circuit pattern at opposite ends of the part of the pattern to be removed, and means for passing electric current between said contact members through said circuit pattern for heating said part of the pattern to soften it.

4. A tool according to claim 1 wherein the body has a sliding lost-motion connection with the means mounting the cutting members so that the mounting means can remain stationary with respect to said one face of the circuit board while the body moves with respect to the circuit board, and the means for effecting joint movement of the cutting members comprises cam members fixed to the body and engageable with the cutting members for moving the cutting members in their mounting means when there is relative movement between the body and the mounting means.

5. A tool according to claim 1 wherein the means mounting the cutting members comprises a carrier having a sliding lost-motion connection with the tool body, and means on the carrier defining guides for the cutting members.

6. A tool according to claim 5 wherein the means for effecting joint movement of the blades comprises a pair of translatory cams fixed to the tool body and having portions thereof projecting through the carrier, the tool body in operation moving with respect to the carrier thereby causing movement of the cams relative to the carrier, portions of the cams engaging the cutting members to effect sliding movement of the cutting members in their guides when the tool body is moved relative to the carrier.

7. A lancing tool according to claim 5 further comprising wiper means supported by the carrier and engageable with the blades of the cutting members during their movement with respect to the circuit pattern for removing foreign matter from the blades.

8. A tool according to claim 1 further comprising a wiper having portions engageable with the blades of the cutting members, and means biasing the wiper portions toward the blades.

9. A lancing tool for removing parts of a circuit pattern on a face of a printed circuit board, the tool comprising:

- a first assembly adapted to be reciprocated relative to the board and including a pair of translation cams movable therewith,
- a carrier slidably mounted on said first assembly, a stop limiting movement of the carrier assembly relative to the first assembly,
- means biasing the carrier assembly toward engagement with the stop, said carrier assembly including means engageable with the board to move the carrier assembly from the stop and relative to the first assembly when the latter is moved toward the board,
- lancing blades mounted in the carrier assembly for converging cutting movements toward and away from one another, said blades being operated by said cams to reciprocate toward and away from one another for cutting upon relative movement between said first assembly and the carrier assembly as the first assembly moves toward the board.

10. A lancing tool according to claim 9 including a wiper member slidable in the carrier, and biasing means for resiliently engaging the wiper member with said lancing blades.

11. A lancing tool according to claim 10 wherein said wiper member includes passage means connected with vacuum means for drawing chips of material removed by the blades from the circuit pattern when lanced by the blades.

References Cited

UNITED STATES PATENTS

| | | | |
|---|---|---|---|
| 2,342,835 | 2/1944 | Bray | 83—638 X |
| 3,293,355 | 12/1966 | Gropp et al. | 83—5 |

FRANK T. YOST, Primary Examiner

U.S. Cl. X.R.

83—100, 168, 170, 376, 646